(12) United States Patent
Takabatake et al.

(10) Patent No.: US 7,002,807 B2
(45) Date of Patent: Feb. 21, 2006

(54) ELECTRONIC COMPONENT

(75) Inventors: Naritomo Takabatake, Koriyama (JP); Hiroshi Nakamura, Yokohama (JP)

(73) Assignee: Victor Company of Japan, LTD, Kanagawa-Ken (JP)

( * ) Notice: Subject to any disclaimer, the term of this patent is extended or adjusted under 35 U.S.C. 154(b) by 0 days.

(21) Appl. No.: 10/853,125

(22) Filed: May 26, 2004

(65) Prior Publication Data

US 2004/0240187 A1 Dec. 2, 2004

(30) Foreign Application Priority Data

May 30, 2003 (JP) ............................. 2003-154299
Apr. 7, 2004 (JP) ............................. 2004-112860

(51) Int. Cl.
*H05K 7/02* (2006.01)
(52) U.S. Cl. .................... 361/752; 361/728; 174/52.1; 174/52.2
(58) Field of Classification Search ................. 174/50, 174/50.55, 50.56, 50.54, 50.61, 52.2; 361/752
See application file for complete search history.

(56) References Cited

U.S. PATENT DOCUMENTS

| 4,335,932 | A | * | 6/1982 | Herrmann, Jr. ............. 439/587 |
| 5,408,383 | A | * | 4/1995 | Nagasaka et al. ........... 361/707 |
| 5,586,388 | A | * | 12/1996 | Hirao et al. .................... 29/830 |
| 5,646,827 | A | * | 7/1997 | Hirao et al. ................. 361/707 |
| 5,657,203 | A | * | 8/1997 | Hirao et al. ................. 361/707 |
| 6,031,732 | A | * | 2/2000 | Koike et al. ................. 361/816 |
| 6,034,876 | A | * | 3/2000 | Ohno et al. .................. 361/752 |
| 6,560,115 | B1 | * | 5/2003 | Wakabayashi et al. ...... 361/728 |

FOREIGN PATENT DOCUMENTS

| JP | 05-055432 | 3/1993 |
| JP | 7-36071 | 4/1995 |

* cited by examiner

*Primary Examiner*—Kamand Cuneo
*Assistant Examiner*—Dameon E. Levi
(74) *Attorney, Agent, or Firm*—Jacobson Holman PLLC (57) ABSTRACT

An electronic component has a casing having a resin injecting section having at least one wall. At least one circuit board is housed in the casing, next to the resin injecting section via the wall. At least one lead terminal is provided in the casing. The lead terminal has a first end and a second end, and a middle section connected between the first and second ends. The first end of the lead terminal is connected to the circuit board in a way that the middle section of the lead terminal is provided as straddling the wall of the resin injecting section. Also provided is at least one lead wire having a third end and a fourth end. The third end of the lead wire is connected to the second end of the lead terminal in the resin injecting section. The fourth end of the lead wire is pulled out from the casing. The third end of the lead wire and the second end of the lead terminal connected to each other are embedded in resin injected in the resin injecting section whereas the middle section of the lead terminal straddling the wall of the resin injecting section is not embedded in the resin. Instead of straddling the wall of the resin injecting section, the middle section of the lead terminal may be inserted into an opening provided on the wall and connected to the circuit board.

6 Claims, 7 Drawing Sheets

ELECTRONIC COMPONENT

BACKGROUND OF THE INVENTION

The present invention relates to an electronic component having a circuit board housed in a casing, and input and output lead wires. Particularly, the present invention relates to an electronic component having a circuit board housed in a casing, and input and output lead wires fixed to the casing with resin injected in the casing.

An electronic component having a circuit board housed in a casing, and input and output lead wires for electrical connections is disclosed in Japanese Un-examined Utility Model No. 7 (1995)-36071.

This known electronic component is a current sensor for detecting a current flowing through an electric wire. Lead wires soldered to the circuit board are pulled out from the casing and connected to an external device, etc.

The known electronic component, however, has low workability in connecting the lead wires to the circuit board. Because, it is required to wind the lead wires around terminals fixed to the circuit board or pass the lead wires through openings provided on the circuit board.

In order to improve workability, Japanese Un-examined Patent publication No. 5 (1993)-55432 discloses an electronic component in which clipleads are connected to a circuit board, and then lead wires are crimped to the clip leads.

There is a demand for further cheaper and compact electronic components. Another demand are vibration- and impact-proof highly reliable electronic components for compact electric vehicles, such as, hybrid cars, and also for current sensors, such as, the one described above.

However, in known electronic components, such as, the one disclosed in Japanese Un-examined Patent publication No. 5 (1993)-55432, when external force is applied, in a direction of pulling, to the lead wires pulled out from the casing to connect the circuit board and an external device, stress is focused on contact points of the circuit board and the clipleads, and also the clip leads and the lead wires, thus causing bad electrical contact. Especially, the contact points of the dip leads and the lead wires have low contact strength, and hence often suffer from bad electrical contact.

SUMMARY OF THE INVENTION

A purpose of the present invention is to provide a highly reliable electronic component with an adequate amount of resin.

The present invention provides an electronic component comprising: a casing having a resin injecting section having at least one wall; at least one circuit board housed in the casing, next to the resin injecting section via the wall; at least one lead terminal having a first end and a second end, and a middle section connected between the first and second ends, the first end of the lead terminal being connected to the circuit board in a way that the middle section of the lead terminal is provided as straddling the wall of the resin injecting section; and at least one lead wire having a third end and a fourth end, the third end of the lead wire being connected to the second end of the lead terminal in the resin injecting section, the fourth end of the lead wire being pulled out from the casing, the third end of the lead wire and the second end of the lead terminal connected to each other being embedded in resin injected in the resin injecting section whereas the middle section of the lead terminal straddling the wall of the resin injecting section is not embedded in the resin.

Moreover, the present invention provides an electronic component comprising: a casing having a resin injecting section having at least one wall; at least one circuit board housed in the casing, next to the resin injecting section via the wall; at least one lead terminal having a first end and a second end, and a middle section connected between the first and second ends, the first end of the lead terminal being connected to the circuit board, the middle section of the lead terminal being inserted into an opening provided on the wall of the resin injecting section; and at least one lead wire having a third end and a fourth end, the third end of the lead wire being connected to the second end of the lead terminal in the resin injecting section, the fourth end of the lead wire being pulled out from the casing, the third end of the lead wire and the second end of the lead terminal connected to each other being embedded in resin injected in the resin injecting section.

DETAILED DESCRIPTION OF PREFERRED EMBODIMENTS

Several embodiments according to the present invention will be disclosed with reference to the attached drawings.

Figure 1:
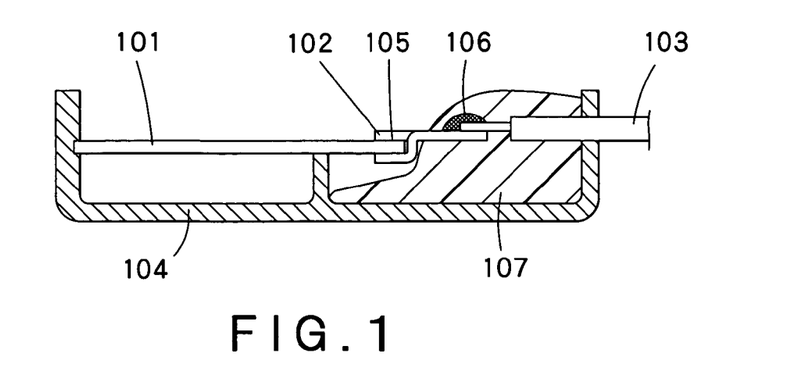
FIG. 1 is a schematic partial cross sectional view of an electronic component, illustrating a problem of this component.

The inventors of the present invention designed an electronic component, such as illustrated in FIG. 1, to solve such a problem discussed above. A circuit board 101 was housed in a casing 104. A clip lead 102 was fixed to the circuit board 101 at an end 105 thereof. A lead wire 103 was connected to the cliplead 102 at a contact point 106. The contact point 106 was covered with epoxy resin 107 so that it is fixed to the casing 104.

The structure, however, had another problem in that, when the epoxy resin 107 was injected in the casing 104, it was inevitably injected into unnecessary sections in the casing 104. This lead to residual stress remaining after the resin was hardened and uneven distribution of the residual stress, thus causing distortion or fracture.

Another problem on this structure was difficulty in control of the amount of resin to be injected. It happened that the contact point 106 was covered with very thick resin. The thickness of resin was not constant when many casings of this structure were produced, which resulted in variation in strength at the contact point, and hence low reliability.

The inventors of the present invention have reached the invention of a highly reliable electronic component with an adequate amount of resin, which does not suffer such problems.

Figure 2A:
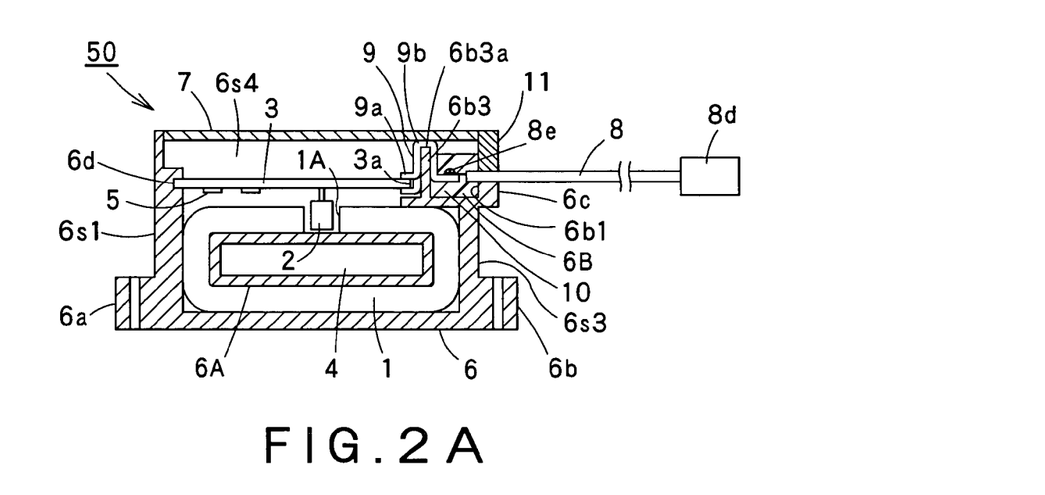
FIG. 2A show a cross sectional view of an electronic component, as a first embodiment of the present invention.
Figure 2B:
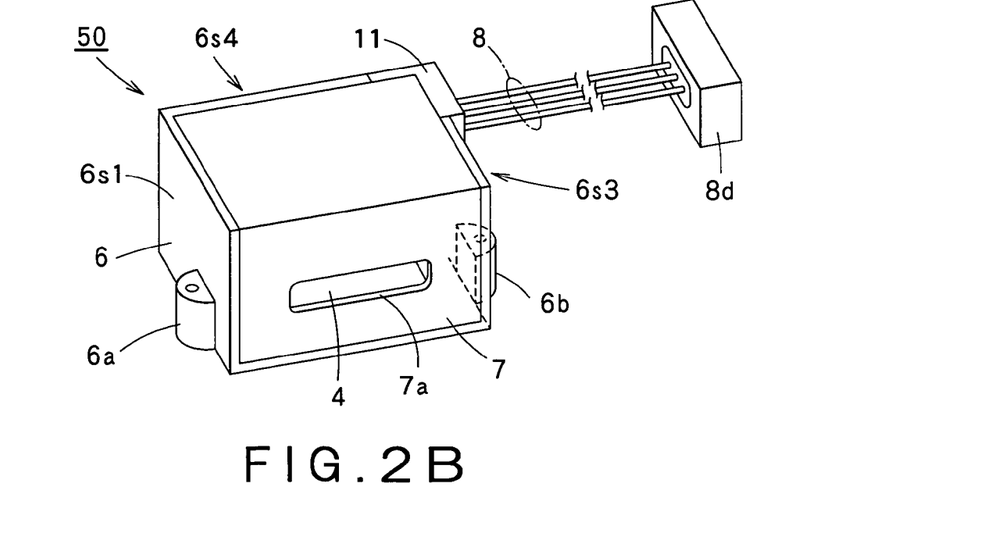
FIG. 2B is a perspective view of the first embodiment.
Figure 3:
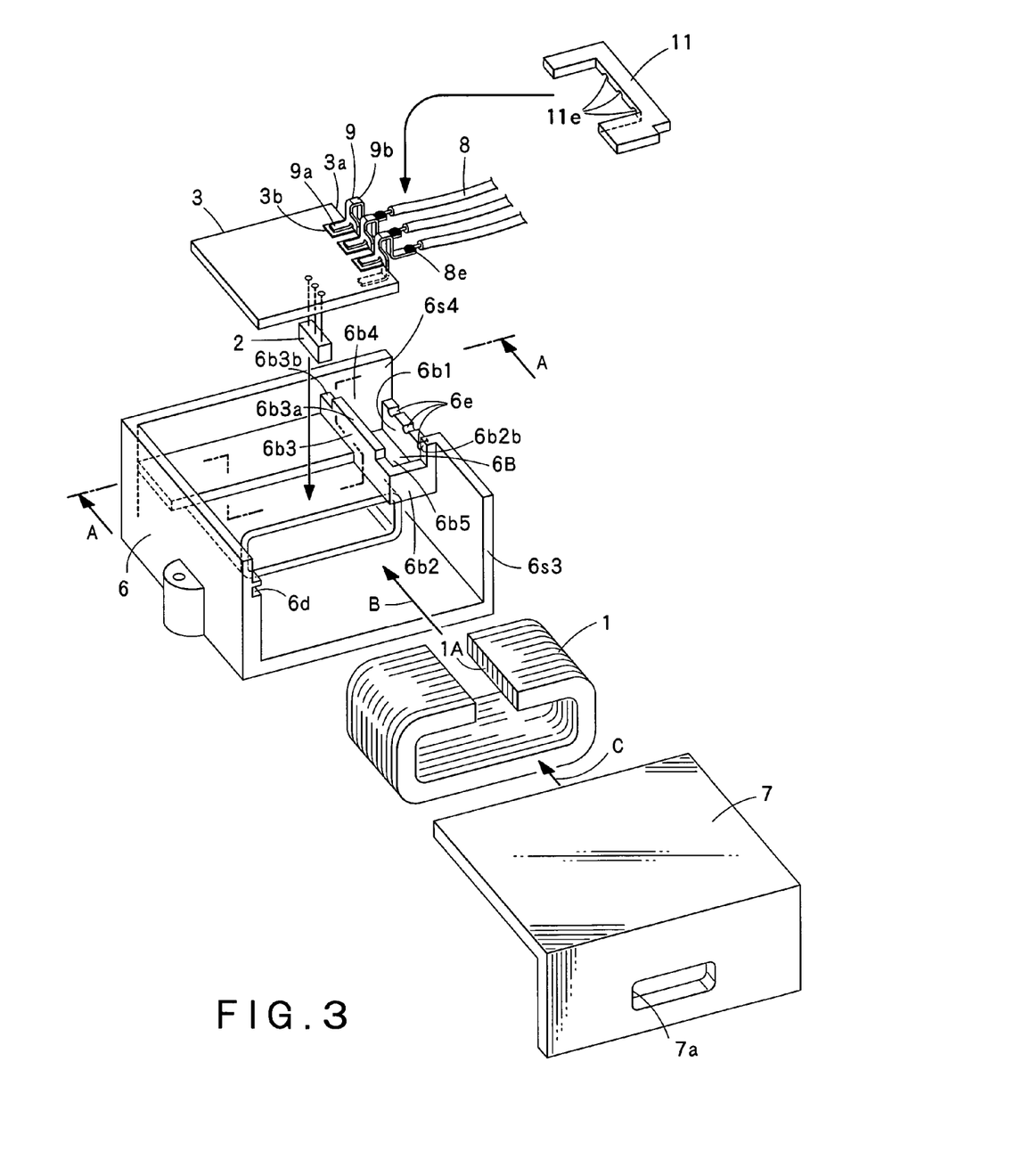
FIG. 3 is an assembly view illustrating how to assemble the first embodiment.
Figure 4:
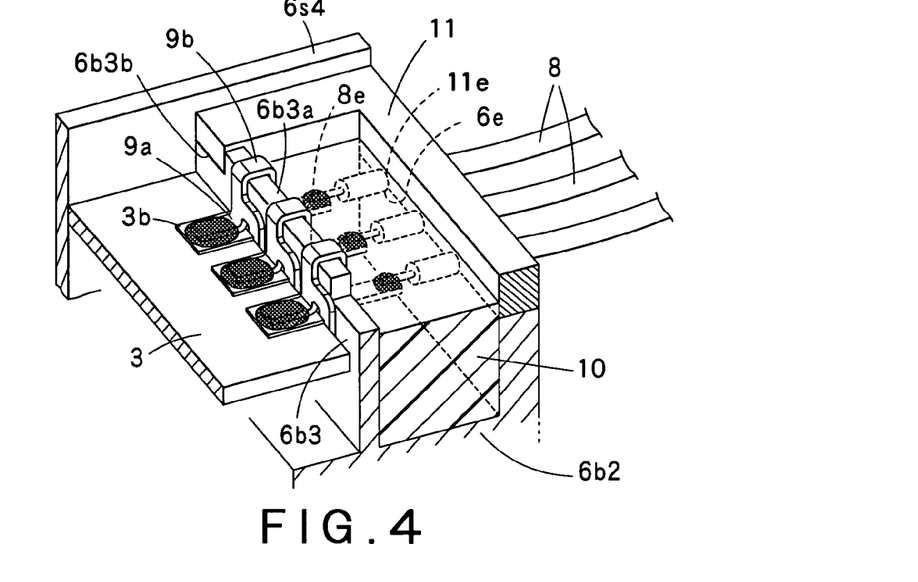
FIG. 4 is a partially enlarged view of the first embodiment.

FIGS. 2A, 2B, 3 and 4 show a current sensor 50, a first embodiment of an electronic component according to the present invention. FIG. 2A show a cross section of the first embodiment. FIG. 2B is a perspective view of the first embodiment. FIG. 3 is an assembly view illustrating how to assemble the first embodiment. FIG. 4 is a partially enlarged view of the first embodiment. FIG. 2A is a view taken on line A—A of FIG. 3. Epoxy resin 10 is indicated with dots for its cross section only in FIG. 2A so that elements covered with resin 10 can been seen.

The current sensor 50 (the first embodiment) accurately detects a large current flowing through a current path with no loads applied thereto.

As shown in FIG. 2A, a hall element 2 mounted on a circuit board 3 is situated in a magnetic gap 1A of a loop-like magnetic core 1. A conducting wire (not shown) is inserted into the magnetic core 1. A current flowing through the conducting wire is detected by the hall element 2.

The magnetic core 1 and the circuit board 3 having the hall element 2 and other elements 5 mounted thereon are housed in an open-top and -front casing 6. The casing 6 is covered with a cover 7 having a shape of the character "L" to cover the open top and the open front, as shown in FIG. 2B.

The casing 6 and the cover 7 can be made of resin, such as, PBT (polybutylene terephthalate).

Provided on side walls 6s1 and 6s3 of the casing 6 at their lower sections are fittings 6a and 6b, respectively, so that the current sensor 50 can be attached to another equipment (not shown) with screws.

A wire pull-out section 6c sticks out from the side wall 6s3 at the upper portion thereof, as shown in FIG. 2A. Three lead wires 8 are pulled out from the wire pull-out section 6c and connected to a connector 8d for electrical input and output.

Formed inside the casing 6 is a rectangular-loop magnetic-core guide 6A sticking out from a rear wall 6s4 to the open front. The magnetic core 1 is attached around the guide 6A as the magnetic gap 1a faces upwards.

The magnetic core 1 is made by punching a thin Permalloy plate into several plates of a specific shape and laminating them.

The cover 7 is formed as having an opening 7a (FIG. 2B) that matches the inner shape of the magnetic-core guide 6A. A conducting wire (not shown) to be detected for current is inserted into a cavity 4 of the magnetic-core guide 6A and the opening 7a.

Provided at the upper section inside the casing 6 and formed as a concave on the inner surface of the left side wall 6s1 (FIG. 2A) is a holder 6d to hold the circuit board 3. The circuit board 3 is held by the holder 6d so that the hall element 2 mounted thereon is situated in the magnetic gap 1A.

As shown in FIG. 3, three pairs of lands 3b are provided on both sides of the circuit board 3 at one end 3a thereof. Soldered to the lands 3b are clip leads 9 made of metal, such as, an alloy of copper and nickel, an alloy of iron and nickel, or brass. Each clip lead 9 is equipped with a clip-like holder 9a at one end. The clip lead 9 is soldered to the corresponding pair of lands 3b so that the holder 9a holds the circuit board 3 at the lands 3b, for tight contact.

A bent section 9b is formed like a shape "⊓" at the middle portion of each clip lead 9. Formed on the clip lead 9 at the other end against the holder 9a is a connecting section 8e to which the corresponding lead wire 8 is soldered.

Formed at the upper section of the side wall 6s3 are walls 6b1, 6b2, 6b3 and 6b4 with a part of the rear wall 6s4 and also a bottom 6b5. The space surrounded by the walls 6b1 to 6b4 and the bottom 6b5 serves as a resin injecting section 6B.

The inner surface of the bent section 9b of each clip lead 9 is engaged with an upper edge 6b3a of the wall 6b3 of the resin injecting section 6B at the side of circuit board 3, thus the clip lead 9 being provided as straddling the wall 6b3.

The connecting section 8e of each clip lead 9, to which the corresponding lead wire 8 is soldered, is situated in the resin injecting section 6B.

The resin injecting section 6B is filled with hardened epoxy resin 10 so that the connecting section 8e and its surroundings, such as, a part of the bent section 9b of each clip lead 9 are completely embedded in the resin 10, thus these elements being integral with the casing 6.

The wall 6b1 of the resin injecting section 6B, provided at the side of the wire pull-out section 6c, is formed as having semicircular concaves 6e for guiding the lead wires 8. Each lead wire 8 is secured in the corresponding semicircular concave 6e.

Provided over the resin injecting section 6B is a holding flame 11 formed like a shape "⊓" with concaves 11e for holding the lead wires 8. The flame 11 is firmly engaged with cut-away sections 6b2b and 6b3b of, the walls 6b2 and 6b3, respectively. The lead wires 8 are held between the concaves 6e of the wall 6b1 and the concaves 11e of the holding frame 11.

The lead wires 8 are flexible wires covered with insulative coating. The flexible wires covered with insulative coating are held between the concaves 6e of the wall 6b1 and the concaves 11e of the holding frame 11 so that there is almost no gap between the concaves 6e and the concaves 11e. Thus, the injected resin 10 does not leak from the concaves.

The casing 6 is covered with the cover 7 so that the circuit board 3 and the other elements are housed in the casing.

Disclosed next with reference to FIG. 3 is several steps for assembling the current sensor 50, although the invention being not limited to these steps.

Step 1: The clip leads 9 having the bent sections 9b are soldered to the circuit board 3 with the hall element 2 mounted thereon, followed by soldering the lead wires 8 to the clip leads 9 so that the circuit board 3, the clip leads 9, and the lead wires 8 are electrically connected to one another.

Step 2: The loop-like magnetic core 1 having the magnetic gap 1A is put into the casing 6, as indicated by an arrow B, so that the magnetic core guide 6A is fit in the magnetic gap 1A. The magnetic core 1 may be fixed to the casing 6 with an adhesive.

Step 3: The circuit board 3 is fixed in the casing 6 from above with the holder 6d, the bent section 9b of each clip lead 9 being engaged with the wall 6b3 of the resin injecting section 6B, the insulative coating of each lead wire 8 being fit in the corresponding concave 6e of the wall 6b1.

Step 4: The holding frame 11 is attached to the resin injecting section 6B from above so that it is firmly engaged with the cut-away sections 6b2b and 6b3b. Thus, the lead wires 8 are held between the wall 6b1 and the holding frame 11 with almost no gaps.

Step 5: The resin 10 is injected into the resin injecting section 6B and hardened, with the connecting section 8e of each clip lead 9 connected to the corresponding lead wire 8 and its surroundings being completely embedded in the resin 10, thus being integral with the casing 6. The resin 10 is an epoxy resin, although the invention is not limited to it.

Step 6: The casing 6 is covered with the cover 7, as indicated by an arrow C, to finish the assembly of the current sensor 50.

The first embodiment (current sensor 50) of the electronic component according to the present invention is provided with the box-like resin injecting section 6B with the resin 10 injected therein. Thus, the lead wires 8 is completely embedded in the resin 10 of an adequate amount with no leakage of the resin 10 to other sections in the casing 6 which could otherwise cause defects.

Moreover, as shown in FIG. 4, each clip lead 9 in the first embodiment is equipped with the bent section 9b that is provided as straddling the wall 6b3 of the resin injecting section 6B, which prevents the resin 10 from leaking beyond the wall 6b3.

The bent sections 9b of the clip leads 9 can be formed in various shapes in accordance with the location of the circuit board 3 in the vertical direction in FIG. 2A, which allows various shapes and optimum layouts for the elements in the casing 6.

Current sensors usually have a larger magnetic core than a circuit board. Therefore, the arrangement shown in FIG. 2A, in which the magnetic core 1 is provided as the magnetic gap 1A faces upwards, with the circuit board 3 and the resin injecting section 6B aligned in parallel over the magnetic core 1, offers the most compact sensor module.

Figure 5A:
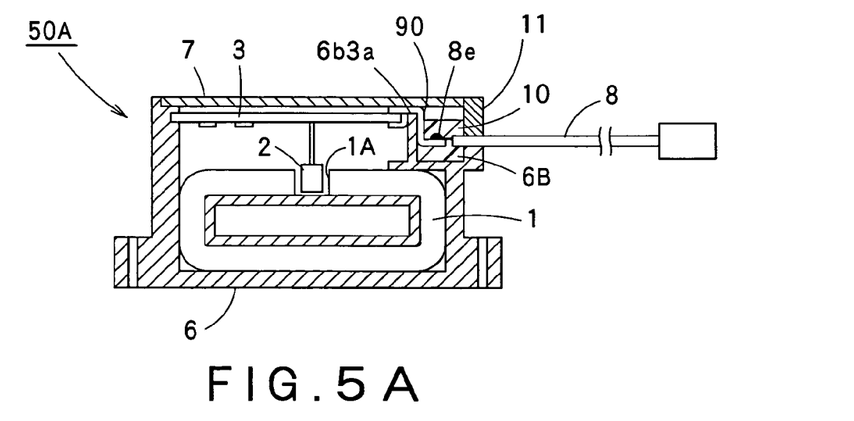
FIG. 5A is a cross sectional view of a first modification to the first embodiment of the electronic component according to the present invention.

Shown in FIG. 5A is a first modification to the first embodiment of the electronic component according to the present invention. Elements shown in FIG. 5A the same as or analogous to those shown in FIGS. 2A to 4 are given the same reference numerals and not explained.

A current sensor 50A shown in FIG. 5A is equipped with clip leads 90 having "L"-shaped bent sections engaged with the wall 6B3 of the resin injecting section 6B, different from the "Π"-shaped bent sections 9b of the clip leads 9 in the first embodiment.

This modification offers a wide space between the circuit board 3 and the magnetic core 1 so that relatively tall elements can be mounted on the circuit board 3. For shorter elements, however, the first embodiment having the " "-shaped bent sections 9b for the clip leads 9 is the best choice for compactness.

Figure 6A:
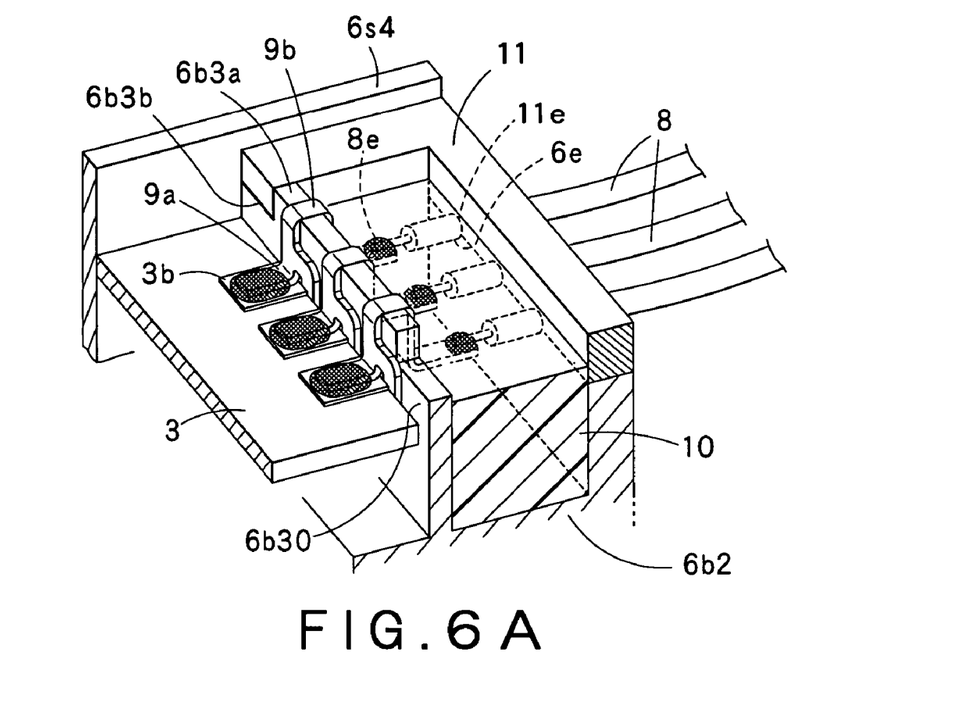
FIG. 6A is a partial perspective view of a second modification to the first embodiment of the electronic component according to the present invention.
Figure 6B:
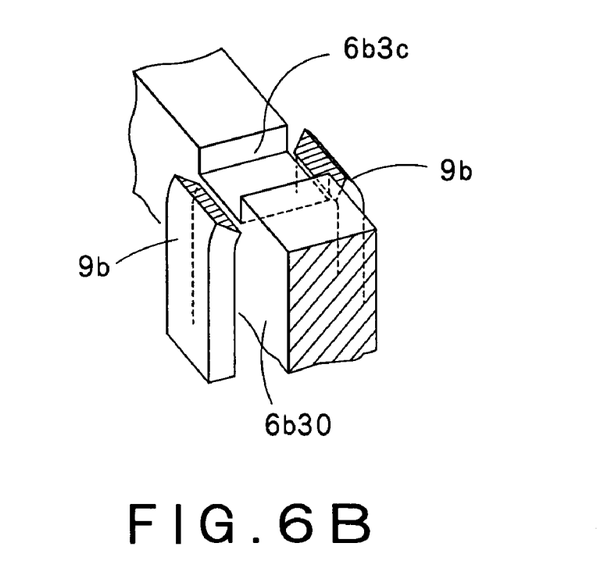
FIG. 6B is a partially enlarged perspective view of the second modification.

Shown in FIGS. 6A and 6B is a second modification to the first embodiment of the electronic component according to the present invention. Elements shown in FIGS. 6A and 6B the same as or analogous to those shown in FIGS. 2A to 4 are given the same reference numerals and not explained.

As illustrated in a partially enlarged view FIG. 6B, a wall 6b30 of a resin injecting section in this modification is provided with concaves 6b3c having the right size so that the bent sections 9b of the clip leads 9 fit in the concaves 6b3c, as shown in FIG. 6A.

This modification is advantageous in that the clip leads 9 can always be put into the right places, thus offering easy assembly and high quality of the electronic component.

Figure 7:
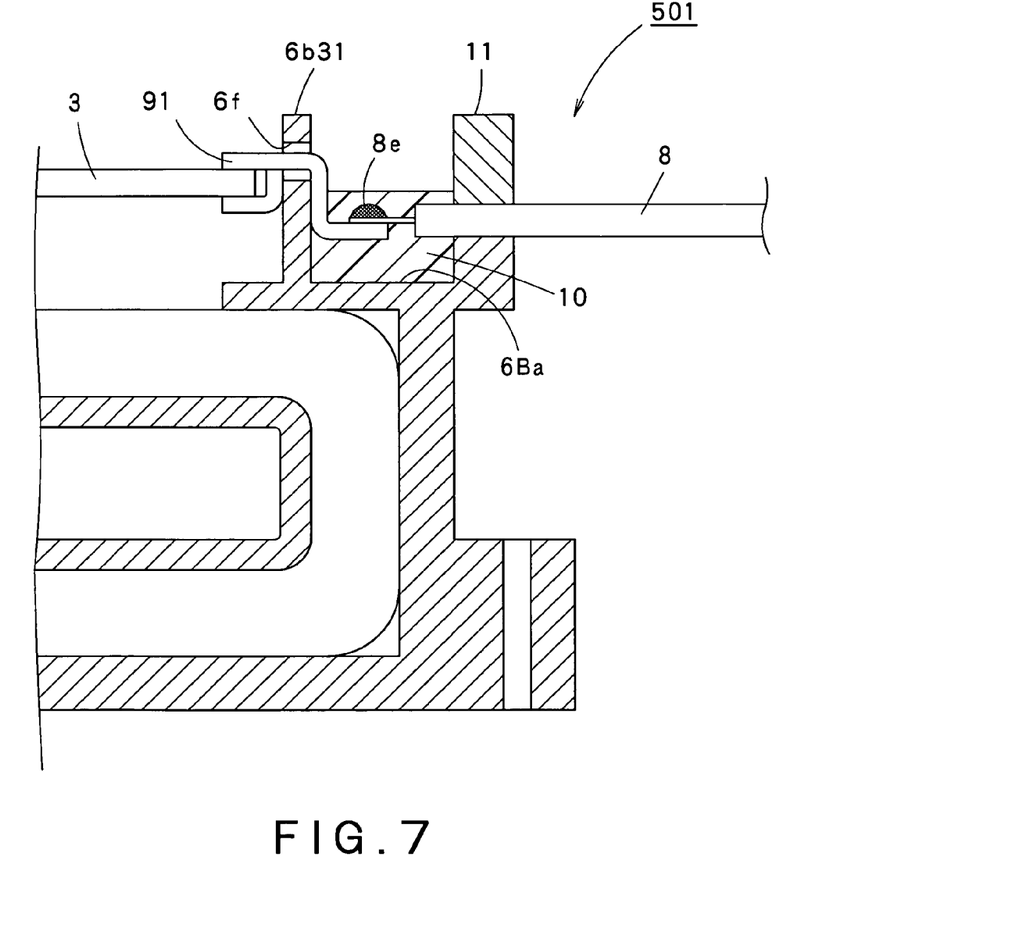
FIG. 7 is a partial cross sectional view of a second embodiment of an electronic component according to the present invention.

FIG. 7 shows a current sensor 501, a second embodiment of an electronic component according to the present invention. Elements shown in FIG. 7 the same as or analogous to those shown in FIGS. 2A to 4 are given the same reference numerals and not explained.

The difference in the first embodiment and the second embodiment is as follows:

In the first embodiment, each clip lead 9 having the " "-shaped bent section 9b is provided as straddling the upper edge 6b3a of the wall 6b3 of the resin injecting section 6B, as shown in FIG. 4.

On the other hand, in the second embodiment, clip leads 91 are inserted into openings 6f formed on a wall 6b31 of a resin injecting section 6Ba, as shown in FIG. 7.

Each clip lead 91 inserted into the opening 6f is bent downwards in the resin injecting section 6Ba and connected to the corresponding lead wire 8 at the connecting section 8e.

An adequate amount of the resin 10 is injected in the resin injecting section 6Ba and hardened so that the connecting sections 8e and their surroundings are completely embedded in the resin 10 whereas the openings 6f are exposed.

Figure 8:
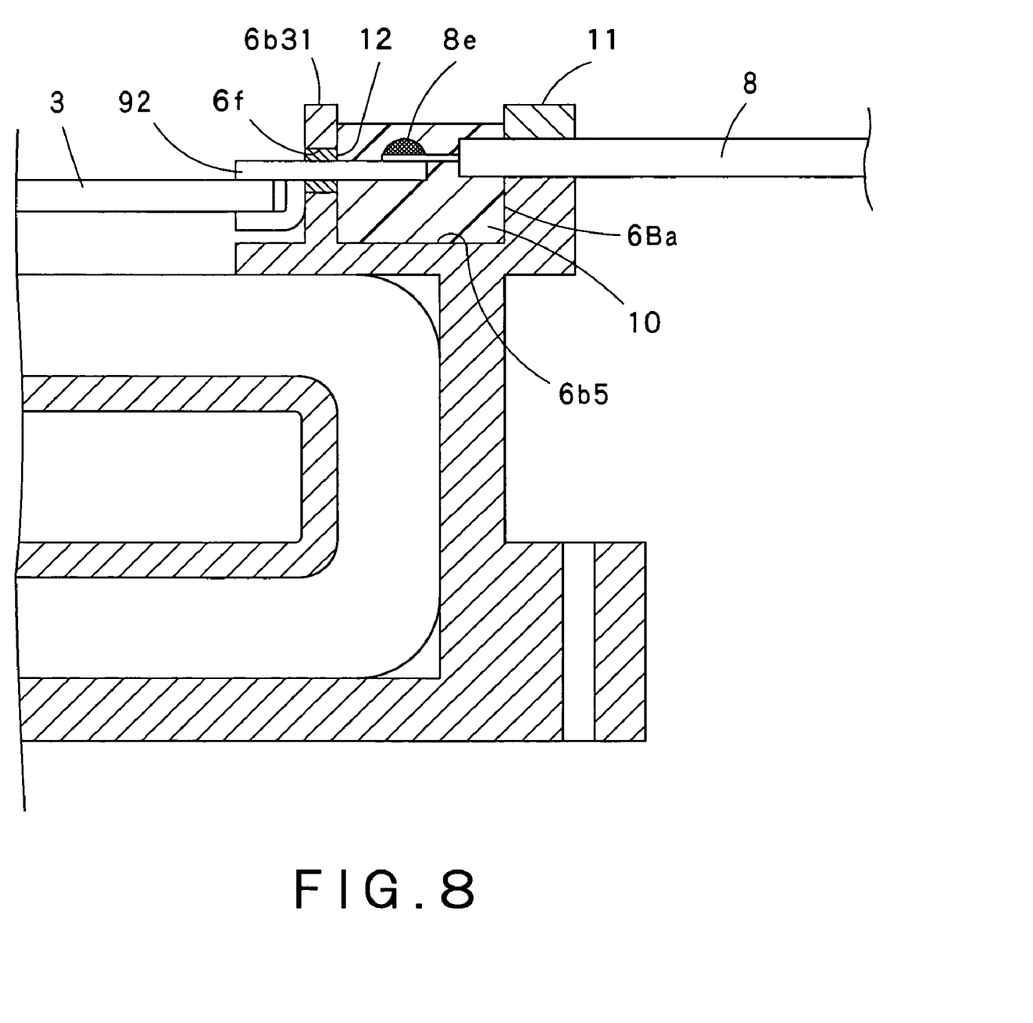
FIG. 8 is a partial cross sectional view of a modification to the second embodiment of the electronic component according to the present invention.

Shown in FIG. 8 is a modification to the second embodiment of the electronic component according to the present invention. Elements shown in FIG. 8 the same as or analogous to those shown in FIG. 7 are given the same reference numerals and not explained.

This modification is different from the second embodiment in that each clip lead 92 inserted into the opening 6f is connected to the corresponding lead wire 8 at the connecting section 8e, without being bent downwards in the resin injecting section 6Ba.

An adequate amount of the resin 10 is injected in the resin injecting section 6Ba and hardened so that the connecting sections 8e, their surroundings, and also the openings 6f are completely embedded in the resin 10.

In this modification, however, a gap is inevitably produced when each clip lead 92 is inserted into the corresponding opening 6f because the former is rectangular whereas the latter is round. The opening 6f is thus applied with a sealant 2 before injection of the resin 10. This prevents leakage of the resin 10 from through the opening 6f.

For example, a UV-hardened adhesive exhibiting high viscosity is applied in the opening 6f and exposed to ultraviolet rays to be hardened, before injecting the resin 10 in the resin injecting section 6Ba. Not only the UV-hardened adhesive, but also other types of materials can be used. In addition, the resin 10 can be used as the sealant 2.

The straight clip leads 92 allow the circuit board 3 and the lead wires 8 to be aligned in an almost same horizontal plane as close as possible to a bottom surface 6b5 of the resin injecting section 6Ba, which make the amount of the injected resin 10 smaller and also the depth of the resin 10 shallower, thus achieving further compactness.

The structure shown in FIG. 8 is achieved by the separate two steps, one to seal the gap between each opening 6f and clip lead 92 inserted thereinto with the sealant 12, and the other to inject the resin 10 in the resin injecting section 6Ba.

Figure 5B:
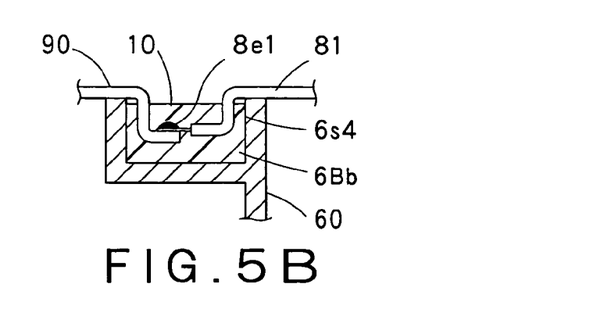
FIG. 5B is a partial cross sectional view of a further modification to the first modification.

The lead wires may not be held by the concaves 6e and 11e. For example, as shown in FIG. 5B illustrating a further modification to the first modification (FIG. 5A), a side wall 6s4 of a resin injecting section 6Bb is formed as higher than the resin 10 in a casing 60. Each lead wire 81 is bent as having an "L"-shaped bent section in the section 6Bb to be connected to the "L"-shaped bent section of the corresponding clip lead 90 at a connecting section 8e1. The further modification does not require the frame 11 shown in FIG. 3.

Instead of the clip leads, known lead terminals with no clipping function may be soldered to the lands 3b of the circuit board 3 in the embodiments and modifications disclosed above.

Figure 9:
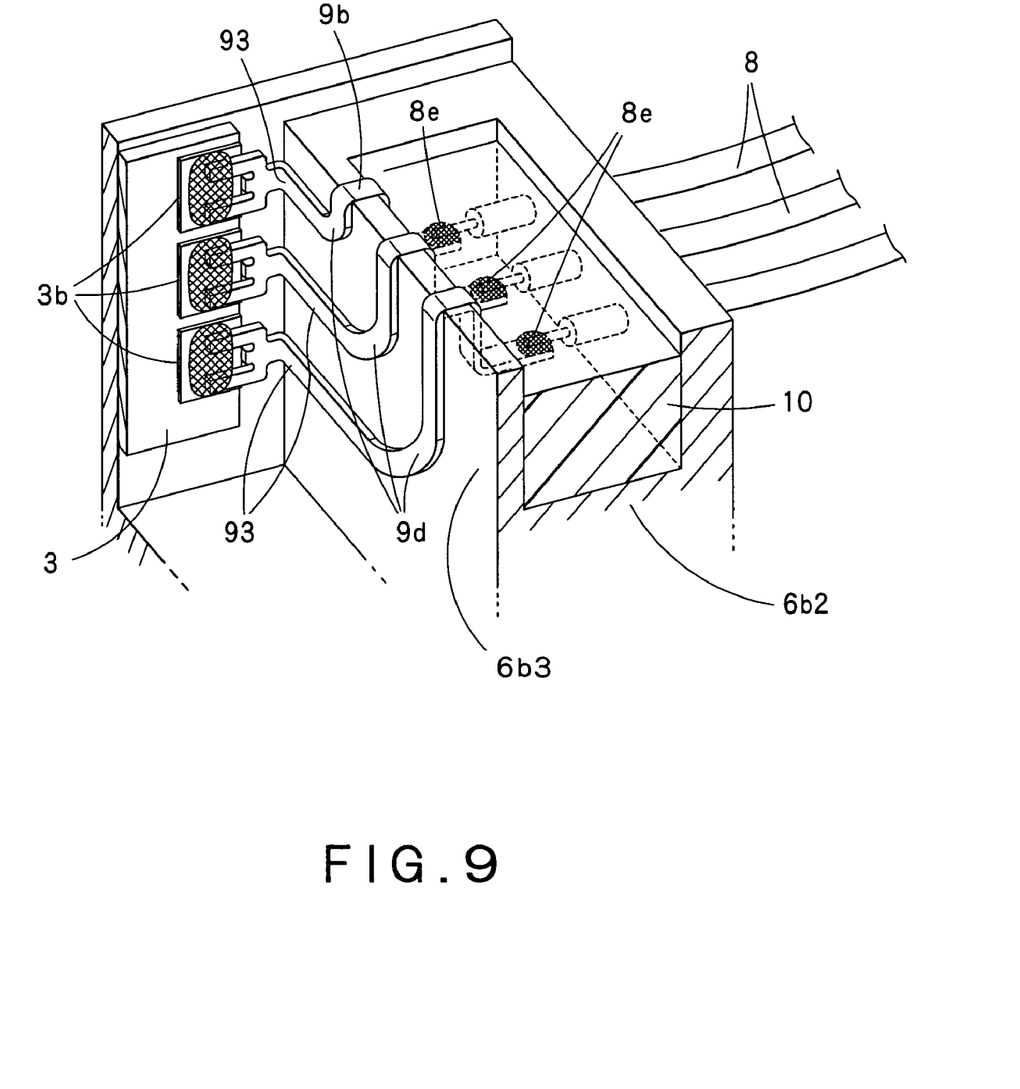
FIG. 9 is a partial perspective view of a further modification to the first embodiment of the electronic component according to the present invention.

The circuit board 3 is provided horizontally in the embodiments and modifications disclosed above. If it is provided vertically, however, clip leads 93, such as shown in FIG. 9, can be used. The clip leads 93 have directional changing sections 9d along the wall 6b3 of the resin injecting section 6B so that they are connected to the circuit board 3 provided vertically.

For instance, in the first embodiment and its modifications, the clip leads 9 can be formed in any shape, such as shown in FIG. 9, along the wall 6b3 of the resin injecting section 6B, between the bent sections 9b and the lands 3b of the circuit board 3. This allows several circuit boards to be provided in parallel in the horizontal or vertical direction in the casing.

The foregoing embodiments and modifications are applied to the current sensors, The present invention is, however, further applicable to other types of electronic components, such as, power sensors and photosensors. In other words, the present invention is applicable to any types of electronic components having at least one circuit board enclosed in a casing and input and output lead wires.

What is claimed is:

1. An electronic component comprising:
   a casing;
   at least one circuit board housed in the casing;
   a resin injecting section provided in the casing, the resin injecting section having at least one wall that partitions the casing into a section in which the circuit board is housed and the resin injecting section;
   at least one lead terminal having a first end and a second end, and a middle section connected between the first and second ends, the first end of the lead terminal being connected to the circuit board in a way that the middle section of the lead terminal is provided as straddling the wall of the resin injecting section; and
   at least one lead wire having a third end and a fourth end, the third end of the lead wire being connected to the second end of the lead terminal in the resin injecting section, the fourth end of the lead wire being pulled out from the casing, the third end of the lead wire and the second end of the lead terminal connected to each other being embedded in resin injected in the resin injecting section whereas the circuit board and the first end of the lead terminal are not embedded in the resin.

2. The electronic component according to claim 1 further comprising a plurality of circuit boards, lead terminals and lead wires, the circuit boards being housed in parallel in the casing, next to the resin injecting section via the wall, each lead terminal having the first end and the second end, and the middle section connected between the first and second ends, the first end of each lead terminal being connected to the corresponding circuit board in a way that the middle section of each lead terminal is provided as straddling the wall, each lead wire having the third end and the fourth end, the third end of each lead wire being connected to the second end of the corresponding lead terminal in the resin injecting section, the fourth end of each lead wire being pulled out from the casing, the third end of each lead wire and the second end of the corresponding lead terminal connected to each other being embedded in the resin whereas the middle section of each lead terminal straddling the wall is not embedded in the resin.

3. An electronic component comprising:
   a casing;
   at least one circuit board housed in the casing;
   a resin injecting section provided in the casing, the resin injecting section having at least one wall that partitions the casing into a section in which the circuit board is housed and the resin injecting section;
   at least one lead terminal having a first end and a second end, and a middle section connected between the first and second ends, the first end of the lead terminal being connected to the circuit board, the middle section of the lead terminal being inserted into an opening provided on the wall of the resin injecting section; and
   at least one lead wire having a third end and a fourth end, the third end of the lead wire being connected to the second end of the lead terminal in the resin injecting section, the fourth end of the lead wire being pulled out from the casing, the third end of the lead wire and the second end of the lead terminal connected to each other being embedded in resin injected in the resin injecting section whereas the circuit board and the first end of the lead terminal are not embedded in the resin.

4. The electronic component according to claim 3, wherein the middle section of the lead terminal inserted into the opening is embedded in the resin while the opening is applied with a sealant.

5. The electronic component according to claim 3 further comprising a plurality of circuit boards, lead terminals and lead wires, the circuit boards being housed in parallel in the casing, next to the resin injecting section via the wall, each lead terminal having the first end and the second end, and the middle section connected between the first and second ends, the first end of each lead terminal being connected to the corresponding circuit board, the middle section of each lead terminal being inserted into the opening, each lead wire having the third end and the fourth end, the third end of each lead wire being connected to the second end of the corresponding lead terminal in the resin injecting section, the fourth end of each lead wire being pulled out from the casing, the third end of each lead wire and the second end of the corresponding lead terminal connected to each other being embedded in resin injected in the resin injecting section.

6. The electronic component according to claim 5, wherein the middle section of each lead terminal inserted into the opening is embedded in the resin while the opening is applied with a sealant.

* * * * *